United States Patent
Yoon et al.

(10) Patent No.: US 7,863,715 B2
(45) Date of Patent: Jan. 4, 2011

(54) STACK PACKAGE AND STACK PACKAGING METHOD

(75) Inventors: Sung-Hwan Yoon, Chungcheongnam-do (KR); Beung-Seuck Song, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 464 days.

(21) Appl. No.: 11/951,048

(22) Filed: Dec. 5, 2007

(65) Prior Publication Data

US 2008/0136008 A1    Jun. 12, 2008

(30) Foreign Application Priority Data

Dec. 7, 2006    (KR) ...................... 10-2006-0124062

(51) Int. Cl.
*H01L 23/495* (2006.01)
(52) U.S. Cl. ................. 257/666; 257/686; 257/E23.085
(58) Field of Classification Search ................. 257/686, 257/666, E23.085
See application file for complete search history.

(56) References Cited

U.S. PATENT DOCUMENTS

2008/0246134 A1* 10/2008 Szewerenko et al. ........ 257/686

FOREIGN PATENT DOCUMENTS

| JP | 09-036297 | 2/1997 |
| KR | 2002-0082543 | 10/2002 |
| KR | 2003-0029681 | 4/2003 |
| KR | 2003-0046933 | 6/2003 |

OTHER PUBLICATIONS

English language abstract of Japanese Publication No. 09-036297.
English language abstract of Korean Publication No. 2002-0082543.
English language abstract of Korean Publication No. 2003-0029681.

* cited by examiner

*Primary Examiner*—Phat X Cao
(74) *Attorney, Agent, or Firm*—Muir Patent Consulting, PLLC

(57) ABSTRACT

Provided are a stack package and a stack packaging method. The stack package includes: a first package; and a second package stacked on the first package, wherein external leads of the first package and the second package are directly connected to one another and inner leads thereof are arranged in different shapes so that the Chip Select signal of the second package are input through a No Select pin of the first package.

15 Claims, 4 Drawing Sheets

STACK PACKAGE AND STACK PACKAGING METHOD

CROSS-REFERENCE TO RELATED PATENT APPLICATIONS

This application claims priority under 35 USC §119 to Korean Patent Application No. 10-2006-0124062, filed on Dec. 7, 2006 in the Korean Intellectual Property Office, the contents of which are incorporated herein in their entirety by reference.

BACKGROUND

1. Technical Field

The present invention relates to a package and a packaging method, and more particularly, to a stack package in which external leads are connected to one another so as to stack a plurality of packages, and a stack packaging method for forming the stack package.

2. Description of the Related Art

Over the past several years, semiconductor manufacturers have endeavored to increase the degree of integration of a semiconductor device and to reduce the size of the semiconductor device. To accomplish this, many research developments and facility investments must be made in order to increase the degree of integration in a semiconductor wafer manufacturing process and hence, significant costs are required. As an example, in the case of a semiconductor memory device, in order to increase the degree of integration from 64 MB DRAM to 256 MB DRAM, many technical problems must be solved in the semiconductor wafer manufacturing process and new equipment must be purchased.

However, a method for increasing the degree of integration without the costs associated with technical developments and facility investments has been developed in a semiconductor package manufacturing process that is subsequent to the semiconductor wafer manufacturing process. The method is to assemble a plurality of semiconductor chips in one semiconductor package. This is because, in a technique for manufacturing a semiconductor package by mounting a plurality of semiconductor chips in one semiconductor package, the degree of integration can be increased with less effort than that required for increasing the degree of integration in a wafer state. For example, if four semiconductor chips of 64 MB DRAM each are inserted and assembled in one semiconductor package, a 256 MB DRAM can be easily manufactured.

Initially, a plurality of semiconductor chips were arranged in a horizontal direction and were assembled in one semiconductor package. However, demands for reducing the size of a semiconductor package was not satisfied by this approach. Thus, most multi-chip semiconductor packages are now manufactured in such a way that a plurality of semiconductor chips are arranged vertically in a semiconductor package.

FIG. 1 is a perspective view of a conventional stack package. Referring to FIG. 1, two packages including an upper package 20 and a lower package 10 are stacked vertically, and external leads of each of the upper package 20 and the lower package 10 are soldered so as to be electrically connected to one another. When a stack package operates as memory, any one of the semiconductor chips (not shown) built in the upper package 20 and the lower package 10, respectively, must be selectively accessed when data is input and output. A Chip Select signal for selecting any one of the semiconductor chips built in the upper package 20 and the lower package 10, respectively, is input through a Chip Select (hereinafter, referred to as /CE) pin.

When a /CE pin 24 of the upper package 20 and a /CE pin 14 of the lower package 10 are arranged in the same sequence, as illustrated in FIG. 1, if a Chip Select signal is selectively input to a semiconductor chip, the /CE pin 24 of the upper package 20 and the /CE pin 14 of the lower package 10 should be electrically isolated from each other. To this end, the /CE pin 24 among the external leads of the upper package 20 is cut so as not to contact the /CE pin 14 of the lower package 10. However, in some cases, solder drops on the /CE pin 14 of the lower package 10 from the cut /CE pin 24 so that the two /CE pins 14 and 24 may be shorted together. In addition, when the cutting length of the /CE pin 24 is larger than a design value, lead formation defects may occur or quality defects, in which a package is suspended on a Pogo pin in a package test process, may occur.

Here, since the /CE pin 24 among the external leads of the upper package 20 is cut, a technique for applying a Chip Select signal to the upper package 20 is needed. To this end, a method of changing bonding wire (not shown) interconnections inside an upper package 20 and a method of changing external lead interconnections outside the upper package 20 may be considered.

In the former case of changing interconnections of bonding wires, one end of the bonding wire is bonded to a bonding pad (not shown) formed in a semiconductor chip, and the other end is connected to a No Select (hereinafter, referred to as NC) pin 21 of the upper package 20. The NC pin 21 of the upper package 20 is soldered with an NC pin 11 of the lower package 10, and a /CE signal of the upper package 20 is input through the NC pin 21 of the upper package 20. However, in this approach, the bonding wires inside the upper package 20 are entangled making an interconnection structure complicated. Also, bonding wire connecting structures of the upper package 20 and the lower package 10 do not coincide with each other so that work sequences and details have to be separated for a wire bonding process, which causes lowering of quality and productivity.

In the latter case of changing interconnections of external leads outside the upper package 20, a flexible circuit (not shown) or a connection member 30 for connecting the cut /CE pin 24 of the upper package 20 and the NC pin 11 of the lower package 10 are inserted between the upper and lower packages 10 and 20. However, the connection member 30 has to be aligned in a correct position. Thus, a process of stacking packages is complicated and if the connection member 30 is misaligned, a short may occur between external leads. The present invention addresses these and other disadvantages of the conventional art.

SUMMARY

The present invention provides a stack package in which packages capable of selectively inputting signals are stacked without cutting external leads when a plurality of packages are stacked. The present invention also provides a stack packaging method for forming the stack package.

According to an aspect of the present invention, there is provided a stack package, the stack package including: a first package to which a Chip Select signal is input through a Chip Select pin among a plurality of external leads; and a second package stacked on the first package, wherein external leads of the first package and the second package are directly connected to one another and inner leads thereof are arranged in different shapes so that a Chip Select signal of the second package is input through a No Select pin among the external leads of the first package.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
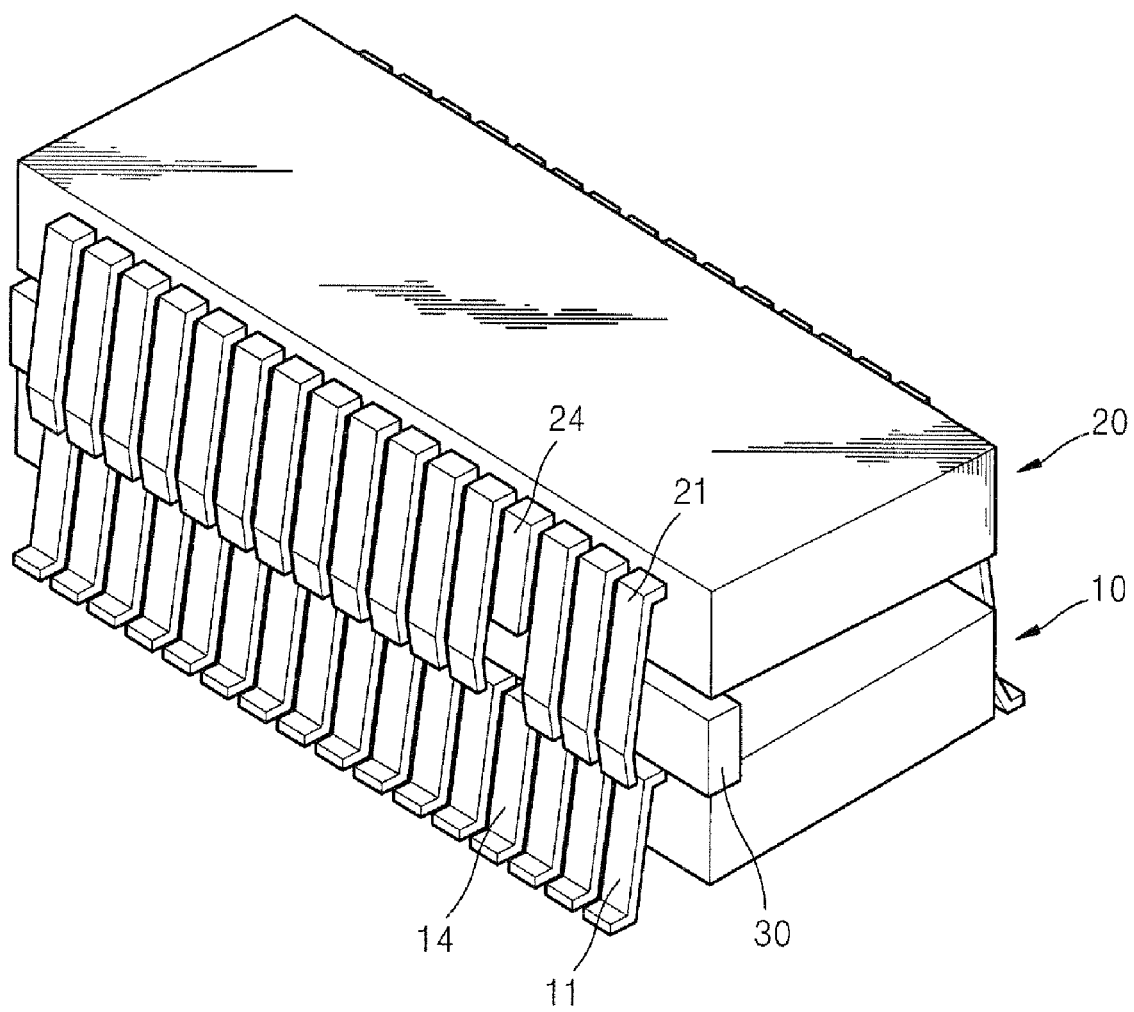
FIG. 1 is a perspective view of a conventional stack package.
Figure 2:
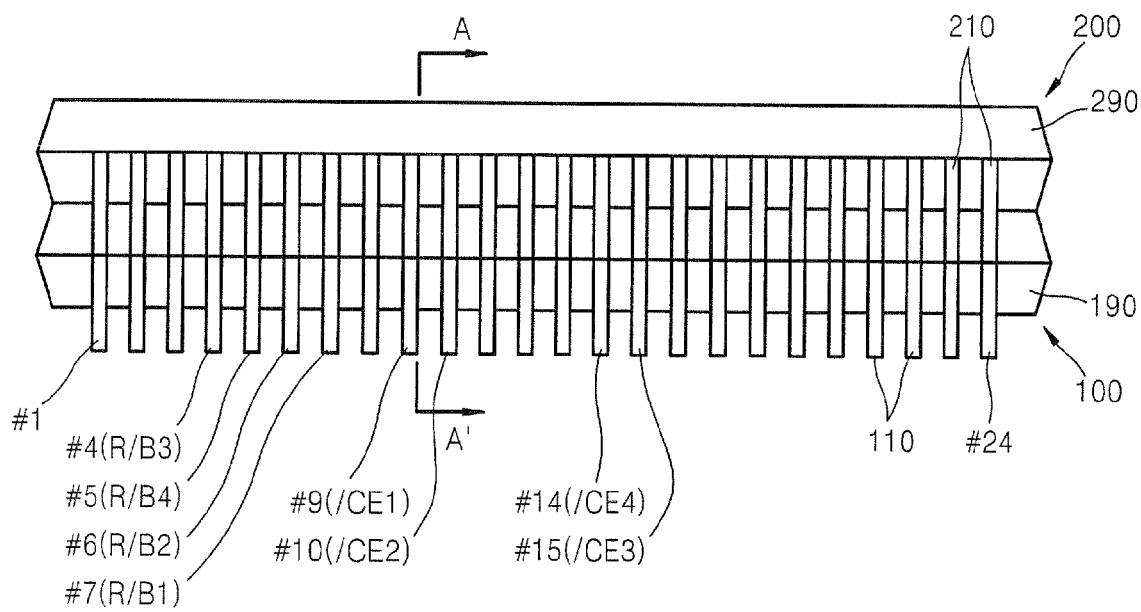
FIG. 2 is a side view of a stack package according to an embodiment of the present invention.
Figure 3:
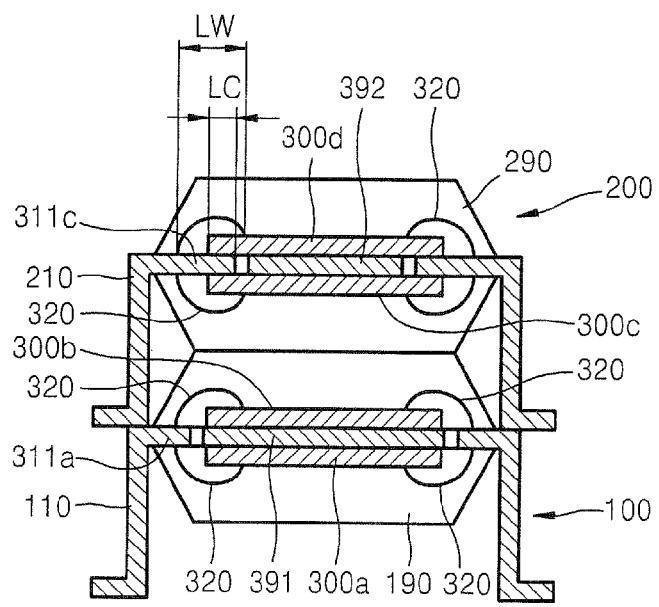
FIG. 3 is a cross-sectional view taken along line A-A' of FIG. 2.

FIG. 2 is a side view of a stack package according to an embodiment of the present invention, and FIG. 3 is a cross-sectional view taken along line A-A' of FIG. 2. A stack structure of a plurality of packages will be described with reference to FIGS. 2 and 3.

Hereinafter, for example, #1, #2, #3, #4, etc. denote pin numbers of external leads 110 of a first package 100 and external leads 210 of a second package 200. As shown in FIGS. 2 and 3, the external leads 110 and 210 on the front of the left side are defined as pin #1 and the external leads 110 and 210 on the front of the right side are defined as pin #24. Parentheses beside pin numbers denote the functions of the pins and indicate types of signals transmitted through the external leads 110 and 210 located on corresponding pin numbers. For explanatory convenience, only NC pins, R/B pins, and /CE pins are shown. External leads 110 and 210 whose pin numbers and functions are not shown are omitted for clarity even though there are various examples of pins such as ground, Vcc, and Vss.

NC pins are No Select Pins and spare pins that are not electrically connected to semiconductor chips 300a, 300b, 300c, and 300d.

R/B pins are pins to which a ready/busy signal is transmitted. For example, when the semiconductor chips 300a, 300b, 300c, and 300d are memory devices, if a ready signal is transmitted through an R/B pin, data are input to and output from the corresponding semiconductor chips 300a, 300b, 300c, and 300d in a ready state, and if a busy signal is transmitted, data cannot be input to and output from the corresponding semiconductor chips 300a, 300b, 300c, and 300d in a busy state. That is, R/B pins convert the states of the semiconductor chips 300a, 300b, 300c, and 300d together with /CE pins.

As illustrated in FIGS. 2 and 3, when two packages 100 and 200 are stacked and two semiconductor chips are disposed in each of the packages 100 and 200, four semiconductor chips 300a, 300b, 300c, and 300d including a first semiconductor chip 300a through a fourth semiconductor chip 300d are stack packaged. In this case, during operation, at least one semiconductor chip is selected and data can be input to and output from the selected semiconductor chip.

The number of packages and the number of semiconductor chips are not limited. In other words, a plurality of semiconductor chips may be built in at least one of a plurality of packages and a plurality of /CE pins or R/B pins having the same number as that of the semiconductor chips may be provided.

The /CE pins are Chip Select pins, and the four semiconductor chips 300a, 300b, 300c, and 300d are connected to the /CE1, /CE2, /CE3, and /CE4 pins, respectively. For example, when '1' is input to the /CE1 pin connected to the first semiconductor chip 300a and '0' is input to the /CE2, /CE3, and /CE4 pins connected to the second, third, and fourth semiconductor chips 300b, 300c, and 300d, the first semiconductor chip 300a is selected for data input and output, and the other second, third, and fourth semiconductor chips 300b, 300c, and 300d are not selected.

In the stack package, an external lead 210 of the second package 200 has the same shape as that of the external lead 110 of the first package 100 and is directly soldered with the external lead 110 of the first package 100. A signal of the second package 200 together with a signal of the first package 100 is transmitted through the external lead 110 of the first package 100. As a result, the /CE1 through /CE4 pins correspond to pin #9, pin #10, pin #15, pin #14 of the first package 100, respectively. Similarly, R/B1 through R/B4 pins are connected to the first semiconductor chip 300a through the fourth semiconductor chip 300d, respectively, and correspond to pin #7, pin #6, pin #4, and pin #5 of the first package 100, respectively.

Figure 4:
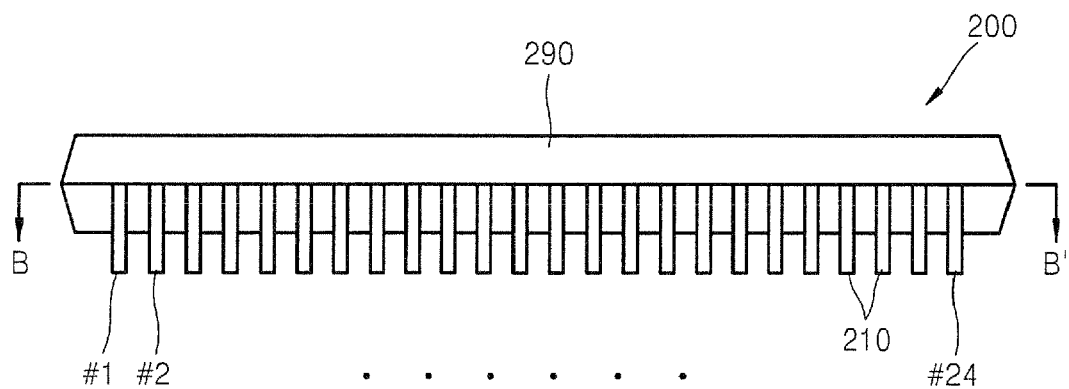
FIG. 4 is a side view of a second package according to an embodiment of the present invention.
Figure 5:
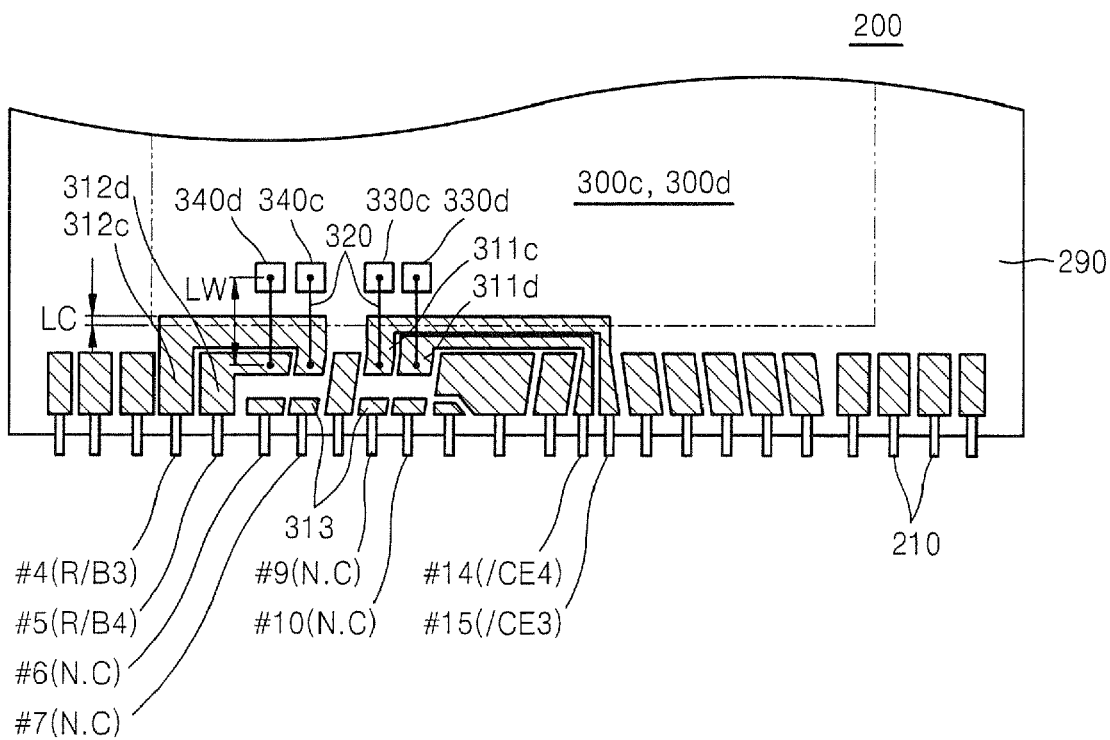
FIG. 5 is a cross-sectional view taken along line B-B' of FIG. 4.
Figure 6:
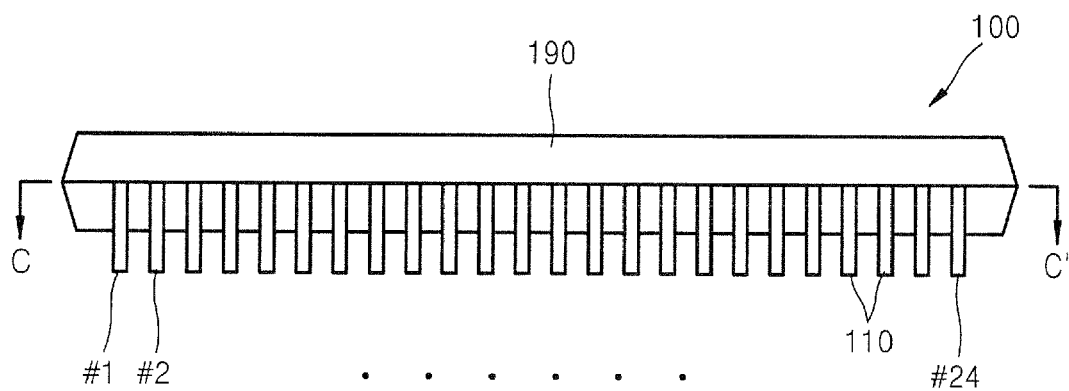
FIG. 6 is a side view of a first package according to an embodiment of the present invention.
Figure 7:
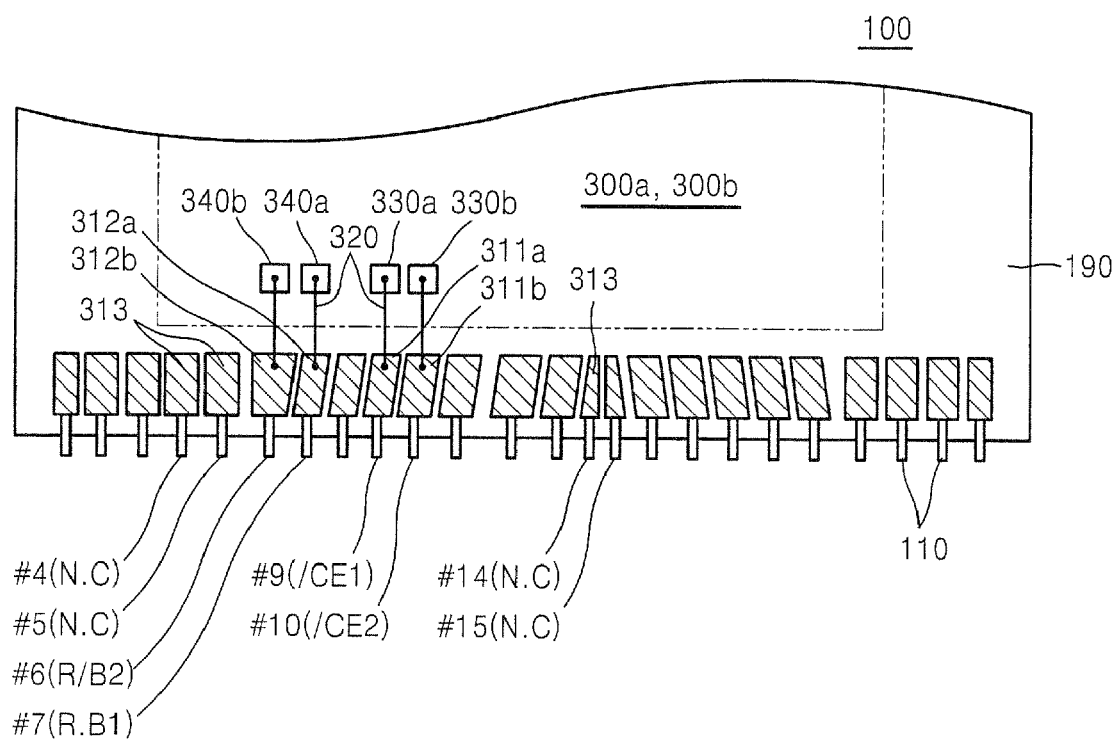
FIG. 7 is a cross-sectional view taken along line C-C' of FIG. 6.

FIG. 4 is a side view of the second package 200 according to an embodiment of the present invention. FIG. 5 is a cross-sectional view taken along line B-B' of FIG. 4. FIG. 6 is a side view of the first package 100 according to an embodiment of the present invention. FIG. 7 is a cross-sectional view taken along line C-C' of FIG. 6. A stack package and a stack packaging method will be described in detail with reference to FIGS. 2 through 7.

Referring to FIGS. 3 and 7, in the first package 100, the first semiconductor chip 300a and the second semiconductor chip 300b are attached to surfaces of a lead frame paddle 391 using, for example, an electrically insulating adhesive or adhesive tape. Inner leads 311a, 311b, 312a, and 312b and bonding pads 330a, 330b, 340a, and 340b are connected to one another, respectively, using bonding wires 320. The first and second semiconductor chips 300a and 300b are sealed using sealing resin 190. The /CE1 signal is input through pin #9 and is transmitted to the first semiconductor chip 300a via the inner lead 311a, the bonding wire 320, and the bonding pad 330a. The /CE2 signal is input through pin #10 and is transmitted to the second semiconductor chip 300b via the inner lead 311b, the bonding wire 320, and the bonding pad 330b. The R/B1 signal is input through pin #7 and is transmitted to the first semiconductor chip 300a via the inner lead 312a, the bonding wire 320, and the bonding pad 340a. The R/B2 signal is input through pin #6 and is transmitted to the second semiconductor chip 300b via the inner lead 312b, the bonding wire 320, and the bonding pad 340b.

Referring to FIGS. 3 and 5, in the second package 200, the third semiconductor chip 300c and the fourth semiconductor chip 300d are attached to surfaces of a lead frame paddle 392 using, for example, an electrically insulating adhesive or adhesive tape. Inner leads 311c, 311d, 312c, and 312d and bonding pads 330c, 330d, 340c, and 340d are connected to one another using bonding wires 320. The semiconductor chips 300c and 300d are sealed using sealing resin 290. The /CE3 signal is input through pin #15 and is transmitted to the third semiconductor chip 300c via the inner lead 311c, the bonding wire 320, and the bonding pad 330c. The /CE4 signal is input through pin #14 and is transmitted to the fourth semiconductor chip 300d via the inner lead 311d, the bonding wire 320, and the bonding pad 330d. The R/B3 signal is input through pin #4 and is transmitted to the third semiconductor chip 300c via the inner lead 312c, the bonding wire 320, and the bonding pad 340c. The R/B4 signal is input through pin #5 and is transmitted to the fourth semiconductor chip 300d via the inner lead 312d, the bonding wire 320, and the bonding pad 340d.

Epoxy molding compound (EMC), ceramics, encapsulant, and metal cap may be used as the sealing resins 190 and 290. The bonding pads 330a, 330b, 330c, 330d, 340a, 340b, 340c, and 340d are disposed at both sides of the first through fourth semiconductor chips 300a, 300b, 300c, and 300d along their edges but are not limited to this and may be arranged in a line in the center of the first through fourth semiconductor chips 300a, 300b, 300c, and 300d. In addition, various embodiments of shapes of the stack package, such as a small out-line package (SOP), a quad flat package (QFP), and a chip scale package (CSP), are applicable to the present invention.

The second package 200 is stacked on the first package 100. The inner leads 311c, 311d, 312c, 312d, and 313 of the second package 200 are arranged in a different shape from that of the inner leads 311a, 311b, 312a, 312b, and 313 of the first package 100. The bonding wires 320 of the first package 100 and the boding wires 320 of the second package 200 are different from each other in that each of the bonding wires 320 of the first and second packages 100 and 200 is connected to inner leads each having a different shape. However, except for this difference, the connection structure and length of the bonding wires 320 are substantially the same in each of the first and second packages 100 and 200. The connection length of the bonding wires 320 that is observed from the vertical projection surface of the stack package is shown as 'LW'. It is desirable to ensure that the lengths of the bonding wires 320 in each of the first and second packages 100 and 200 are substantially the same in order to have consistent inductance characteristics in the stack package.

Unlike the prior art, even though the external leads 110 of the first package 100 and the external leads 210 of the second package 200 are directly soldered together and the connection structures of the bonding wires 320 are the same, a Chip Select signal or a ready/busy signal can be independently transmitted to each of the first through fourth semiconductor chips 300a, 300b, 300c, and 300d because the shapes of the inner leads 311a, 311b, 311c, 311d, 312a, 312b, 312c, 312d, 313 are different. A process of assembling the inner leads 311a, 311b, 311c, 311d, 312a, 312b, 312c, 312d, and 313 in each of the first and second packages 100 and 200 is a simpler process, which is advantageous for standardization, than conventional processes so that process accuracy and mass productivity can be significantly improved.

Referring to FIGS. 5 and 7, each of the inner leads 311c and 311d that are connected to the /CE3 pin and the /CE4 pin of the second package 200, includes an extension portion that extends to the /CE3 pin and the /CE4 pin from a wire-bonded portion. In addition, each of the inner leads 311c and 311d includes an isolation portion that isolates the wire-bonded portion from pin #9 and pin #10, which are NC pins.

Similarly, each of the inner leads 312c and 312d that are connected to the R/B3 and R/B4 pins of the second package 200 includes an extension portion that extends to the R/B3 and R/B4 pins from a wire-bonded portion. In addition, each of the inner leads 312c and 312d includes an isolation portion that isolates the wire-bonded portion from pin #6 and pin #7, which are NC pills.

The extension portions may include an overlap length LC, which is held in place by the first through fourth semiconductor chips 300a, 300b, 300c, and 300d. As such, the extension portion is fixed in a predetermined position. In this case, the lead frame paddle 392 of the second package 200 may have a portion removed to accommodate the overlap length LC which is a region in which at least the extension portion is held. Thus, the lead frame paddle 392 of the second package 200 may be different from the lead frame paddle 391 of the first package 100.

As described above, when a plurality of semiconductor chips are packaged, since a plurality of /CE or R/B pins are included, a plurality of extension portions of inner leads may be provided accordingly. In this case, the plurality of extension portions may be arranged such that they do not overlap each other. For example, referring to FIG. 5, an extension portion of the inner lead 311c, to which the /CE3 pin is connected, is spaced apart from an extension portion of the inner lead 311d by a predetermined gap so that the extension portion of the inner lead 311c is not overlapped with the extension portion of the inner lead 311d to which the /CE4 pin is connected. Similarly, an extension portion of the inner lead 312c, to which the R/B3 pin is connected, is spaced apart from an extension portion of the inner lead 312d by a predetermined gap so that the extension portion of the inner lead 312c is not overlapped with the extension portion of the inner lead 312d to which the R/B4 pin is connected.

Chip Select pins of the first package 100 are pin #9 and pin #10 and Chip Select pins of the second package 200 are pin #15 and pin #14 and therefore Chip Select pins of the first package are arranged in different positions from the Chip Select pins of the second package 200. Pin #9 and pin #10, which are the Chip Select pins of the first package 100, are directly connected to pin #9 and pin #10, which are NC pins of the second package 200. Pin #15 and pin #14, which are the Chip Select pins of the second package 200, are directly connected to pin #15 and pin #14, which are NC pins of the second package 200.

Thus, a Chip Select signal of the first package 100 is input through pin #9 and pin #10 of the first package 100, and a Chip Select signal of the second package 200 is input through pin #15 and pin #14 of the first package 100. Therefore, the Chip Select signals can be independently transmitted to each of the first through fourth semiconductor chips 300a, 300b, 300c, and 300d.

Similarly, when the first through fourth semiconductor chips 300a, 300b, 300c, and 300d are selected by combining R/B signals with the Chip Select signals, R/B pins of the first package 100 are pin #7 and pin #6 and R/B pins of the second package 200 are pin #4 and pin #5 and therefore, R/B pins of the first package 100 are arranged in different positions from the R/B pins of the second package 200. Pin #7 and pin #6, which are R/B pins of the first package 100, are directly connected to pin #7 and pin #6, which are NC pins of the second package 200, and pin #4 and pin #5, which are R/B pins of the second package 200, are directly connected to pin #4 and pin #5, which are NC pins of the first package 100. Thus, an R/B signal of the first package 100 is input through pin #7 and pin #6 of the first package 100 and an R/B signal of the second package 200 is input through pin #4 and pin #5 of the first package 100 so that the R/B signals can be independently transmitted to each of the first through fourth semiconductor chips 300a, 300b, 300c, and 300d.

As described above, in the stack package and the stack packaging method according to the present invention, only the shape of inner leads is changed without cutting external leads outside a package or connecting bonding wires inside the package. Consequently, signals can be independently transmitted to a plurality of semiconductor chips, standardization of a packaging process can be obtained, and the accuracy of the packaging process and mass productivity can be improved.

According to an aspect of the present invention, there is provided a stack package, the stack package including: a first package including a Chip Select pin among a plurality of external leads; and a second package stacked on the first package, wherein external leads of the first package and the second package are directly connected to one another and inner leads of the first package and the second package have different shapes so that a Chip Select signal of the second package is input through a No Select pin among the external leads of the first package.

According to another aspect of the present invention, there is provided a stack package, the stack package including: a first package; and a second package stacked on the first package, wherein each of the first package and the second package includes a plurality of external leads, comprising: a No Select pin; a Chip Select pin to which a Chip Select signal is input; and an R/B pin to which a ready/busy signal is transmitted, and wherein external leads of the first package and the second package are directly connected to one another and inner leads of the first package and the second package have different shapes so that the Chip Select signal and the ready/busy signal of the second package are input through a No Select pin of the first package.

According to another aspect of the present invention, there is provided a stack packaging method including vertically stacking two or more packages, each of the packages including one or more semiconductor chips and a plurality of external leads, comprising: a No Select pin, a Chip Select pin to which a Chip Select signal is input, and an R/B pin to which a ready/busy signal is transmitted, wherein external leads of the packages are directly connected to one another, the Chip Select pin and the R/B pin of the packages are disposed in different positions and inner leads of the packages have different shapes so that the Chip Select signal or the ready/busy signal of the packages can be independently transmitted to each of the semiconductor chips.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A stack package, comprising:
a first package including a Chip Select pin among a plurality of external leads; and
a second package stacked on the first package and including a plurality of external leads,
wherein the external leads of the first package and the second package are directly connected to one another and inner leads of the first package and the second package have different shapes so that a Chip Select signal of the second package is input through a No Select pin among the external leads of the first package.

2. The stack package of claim 1, wherein respective bonding wires for transmitting a Chip Select signal to the first package and the second package are bonded to inner leads having different shapes.

3. The stack package of claim 1, wherein the Chip Select pin of the first package and a Chip Select pin of the second package are arranged in different positions, the No Select pin of the first package is directly connected to the Chip Select pin of the second package, and a No Select pin of the second package is directly connected to the Chip Select pin of the first package.

4. The stack package of claim 1, wherein an inner lead connected to a Chip Select pin of the second package comprises an extension portion which extends to the Chip Select pin of the second package from a wire-bonded portion of the inner lead.

5. The stack package of claim 4, wherein the inner lead connected to the Chip Select pin of the second package further comprises an isolation portion which isolates a No Select pin of the second package, to which the Chip Select pin of the first package is directly connected, and the inner lead from each other.

6. The stack package of claim 5, wherein the inner lead connected to the Chip Select pin of the second package is held in a fixed position by a semiconductor chip inside the second package.

7. The stack package of claim 6, wherein a lead frame paddle by which the semiconductor chip inside the second package is supported comprises a space in a region in which the inner lead is held by the semiconductor chip.

8. The stack package of claim 1, wherein more than two packages are stacked, and at least one of the packages, in which a plurality of semiconductor chips are disposed, has a plurality of Chip Select pins, wherein a number of the chip select pins corresponds to a number of the plurality of semiconductor chips.

9. The stack package of claim 8, wherein respective inner leads connected to the plurality of Chip Select pins are disposed in a shape in which the inner leads are not overlapped.

10. A stack package comprising:
a first package; and
a second package stacked on the first package,
wherein each of the first package and the second package comprises a plurality of external leads including:
a plurality of No Select pins;
a Chip Select pin to which a Chip Select signal is input; and
an R/B pin to which a ready/busy signal is transmitted, and
wherein the external leads of the first package and the second package are directly connected to one another and inner leads of the first package and the second package have different shapes so that the Chip Select signal and the ready/busy signal of the second package are each input through a corresponding No Select pin of the plurality of No Select pins of the first package.

11. The stack package of claim 10, wherein the Chip Select pin and the R/B pin of the first package are arranged in different positions from positions of the Chip Select pin and the R/B pin of the second package,
each of the Chip Select pin and the R/B pin of the first package is directly connected to a corresponding No Select pin of the second package, and each of the Chip Select pin and the R/B pin of the second package is directly connected to the corresponding No Select pin of the first package.

12. The stack package of claim 11, wherein each inner lead connected to the Chip Select pin or the R/B pin of the second package comprises an extension portion which extends to the Chip Select pin or the R/B pin of the second package from a wire-bonded portion of the inner lead.

13. The stack package of claim 12, wherein each inner lead connected to the Chip Select pin or the R/B pin of the second package further comprises an isolation portion which isolates the inner lead and a corresponding No Select pin of the second package adjacent to the inner lead from each other.

14. The stack package of claim 13, wherein each inner lead connected to the Chip Select pin or the R/B pin of the second package is held in a fixed position by a semiconductor chip inside the second package.

15. The stack package of claim 10, wherein more than two packages are stacked and at least one of the packages, in which a plurality of semiconductor chips are disposed, has a plurality of Chip Select pins, wherein a number of the plurality of chip select pins corresponds to a number of the plurality of semiconductor chips.

* * * * *